(12) United States Patent  (10) Patent No.: US 7,462,086 B2
Mueller-Mach et al.  (45) Date of Patent: Dec. 9, 2008

(54) PHOSPHOR FOR PHOSPHOR-CONVERTED SEMICONDUCTOR LIGHT EMITTING DEVICE

(75) Inventors: Regina B. Mueller-Mach, San Jose, CA (US); Gerd O. Mueller, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 91 days.

(21) Appl. No.: 10/829,140

(22) Filed: Apr. 21, 2004

(65) Prior Publication Data

US 2005/0236971 A1 Oct. 27, 2005

(51) Int. Cl.
*H01J 9/00* (2006.01)
(52) U.S. Cl. .............................. 445/23; 445/50; 257/98
(58) Field of Classification Search ......... 313/498–512; 252/301.4 R, 301.4 S; 362/800; 445/23–25, 445/50–51; 257/88, 98
See application file for complete search history.

(56) References Cited

U.S. PATENT DOCUMENTS

| | | | |
|---|---|---|---|
| 5,847,507 A | 12/1998 | Butterworth et al. | |
| 5,959,316 A | 9/1999 | Lowery | |
| 5,998,925 A | 12/1999 | Shimizu et al. | |
| 6,069,440 A | 5/2000 | Shimizu et al. | |
| 6,351,069 B1 | 2/2002 | Lowery et al. | |
| 6,501,102 B2 | 12/2002 | Mueller-Mach et al. | |
| 6,921,928 B2 * | 7/2005 | Sonobe | 257/99 |

FOREIGN PATENT DOCUMENTS

| | | | |
|---|---|---|---|
| WO | WO 00/33390 | * | 6/2000 |
| WO | WO 2004/079790 A2 | | 9/2004 |
| WO | WO 2004/084261 A2 | | 9/2004 |

OTHER PUBLICATIONS

European Search Report, 3 pages, Oct. 20, 2005 published.

* cited by examiner

*Primary Examiner*—Joseph L Williams
(74) *Attorney, Agent, or Firm*—Patent Law Group LLP; Rachel V. Leiterman

(57) ABSTRACT

A semiconductor light emitting device comprising a light emitting layer configured to emit light of a first wavelength disposed between an n-type region and a p-type region is combined with a cerium-doped garnet phosphor having a wider excitation spectrum than conventional cerium-doped garnet phosphors. In some embodiments, the phosphor has a cerium concentration between about 4 mol % and about 8 mol %.

5 Claims, 5 Drawing Sheets

PHOSPHOR FOR PHOSPHOR-CONVERTED SEMICONDUCTOR LIGHT EMITTING DEVICE

BACKGROUND

1. Field of Invention

The invention relates generally to phosphor-converted semiconductor light emitting devices.

2. Description of Related Art

Light emitting devices including light emitting diodes (LEDs) are well known solid state devices that can generate light having a peak wavelength in a specific region of the light spectrum. LEDs are typically used as illuminators, indicators, and displays. LEDs based on the III-nitride materials system have been developed that can efficiently emit light in a relatively narrow band around a peak wavelength in the blue to UV range of the spectrum. Since blue-UV light has a higher photo energy relative to other colors of visible light, such light generated by III-nitride LEDs can be readily converted to produce light having a longer wavelength. It is well known in the art that light having a first peak wavelength ("primary light") can be converted into light having a longer peak wavelength ("secondary light") using a process known as luminescence. The luminescence process involves absorbing the primary light by a photoluminescent phosphor material, which excites the atoms of the phosphor material, and emits the secondary light. The peak wavelength and the band of wavelengths around it (in short wavelength) of the secondary light will depend on the phosphor material. The type of phosphor material can be chosen to yield secondary light having a particular peak wavelength.

U.S. Pat. No. 5,998,925, granted to Shimizu et al., teachings a "white light emitting diode comprising a light emitting component using a semiconductor as a light emitting layer and a phosphor which absorbs a part of light emitted by the light emitting component and emits light of wavelength different from that of the absorbed light, wherein the light emitting layer of the light emitting component is a nitride compound semiconductor and the phosphor contains garnet fluorescent material activated with cerium which contains at least one element selected from the group consisting of Y, Lu, Sc, La, Gd and Sm, and at least one element selected from the group consisting of Al, Ga and In and, and is subject to less deterioration of emission characteristic even when used with high luminance for a long period of time." See U.S. Pat. No. 5,998,925, abstract.

SUMMARY

In accordance with embodiments of the invention, a semiconductor light emitting device comprising a light emitting layer disposed between an n-type region and a p-type region is combined with a cerium-doped garnet phosphor having a wider excitation spectrum than conventional cerium-doped garnet phosphors. In some embodiments, the phosphor has a cerium concentration between about 4 mol % and about 8 mol %.

DETAILED DESCRIPTION

Figure 1:
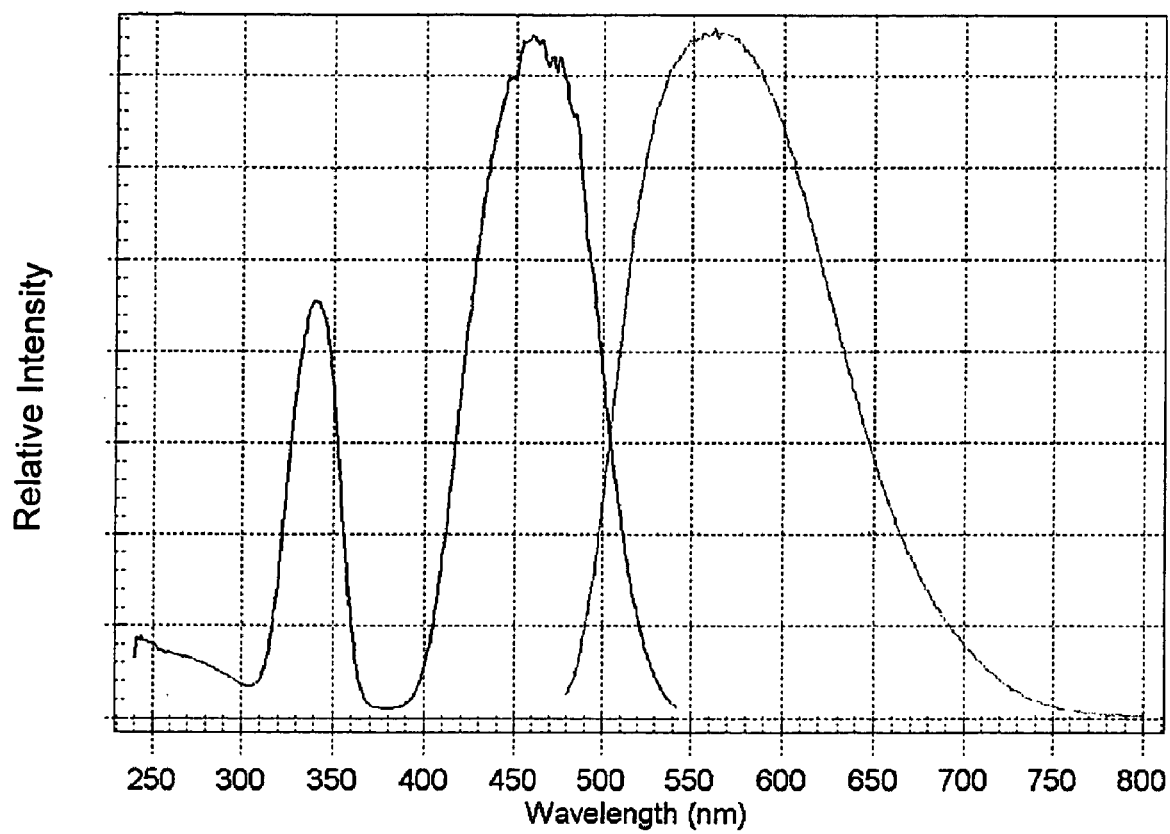
FIG. 1 illustrates the excitation and emission spectra for 2 mol % $Ce^{3+}$ doped $Y_3Al_5O_{12}$ phosphor.

One of the phosphors described in U.S. Pat. No. 5,998,925, $Y_3Al_5O_{12}:Ce^{3+}$, has found widespread use in phosphor-converted LEDs. The mole percent of $Ce^{3+}$ dopant in $Y_3Al_5O_{12}$:$Ce^{3+}$ is generally around about 2%. Such compositions of $Y_3Al_5O_{12}:Ce^{3+}$ emit light in a broad yellow band. FIG. 1 illustrates the excitation and emission spectrum of 2 mol % $Ce^{3+}$ doped $Y_3Al_5O_{12}$. However, the use of $Y_3Al_5O_{12}:Ce^{3+}$, particularly in "high power" devices that operate at high drive currents and high temperatures, presents the difficulties described below.

$Y_3Al_5O_{12}:Ce^{3+}$ has a narrow excitation spectrum, requiring that the wavelength of the LEDs used to pump $Y_3Al_5O_{12}$:$Ce^{3+}$ be tightly controlled. Since the wavelength emitted by an LED typically varies from wafer to wafer, the narrow excitation spectrum of $Y_3Al_5O_{12}:Ce^{3+}$ reduces the number of LEDs suitable for use with the phosphor.

The narrow excitation spectrum is particularly problematic as III-nitride LEDs are operated at higher power. The emission wavelength of III-nitride devices tends to shift toward shorter wavelengths as the operating current density increases, and toward longer wavelengths as the operating temperature of the LED increases. Since the excitation spectrum of $Y_3Al_5O_{12}:Ce^{3+}$ is narrow, even small shifts in the emission wavelength of the device used to pump the $Y_3Al_5O_{12}:Ce^{3+}$ may drastically reduce the amount of absorption and emission from the $Y_3Al_5O_{12}:Ce^{3+}$. In an extreme case, if the emission wavelength of the device shifts enough, the $Y_3Al_5O_{12}:Ce^{3+}$ may not emit any light. In a device such as a white illumination device where light emitted by the LED and light emitted by the phosphor mix to make composite light, as the drive current and operating temperature in the LED increase, and the emission wavelength of the LED shifts, the amount of emission from the $Y_3Al_5O_{12}:Ce^{3+}$ may undesirably decrease, potentially undesirably changing the color temperature and color rendering index of the composite light.

In accordance with embodiments of the invention, compositions of cerium doped garnet phosphors are introduced which have a broader excitation spectrum than conventional $Y_3Al_5O_{12}:Ce^{3+}$.

Figure 2:
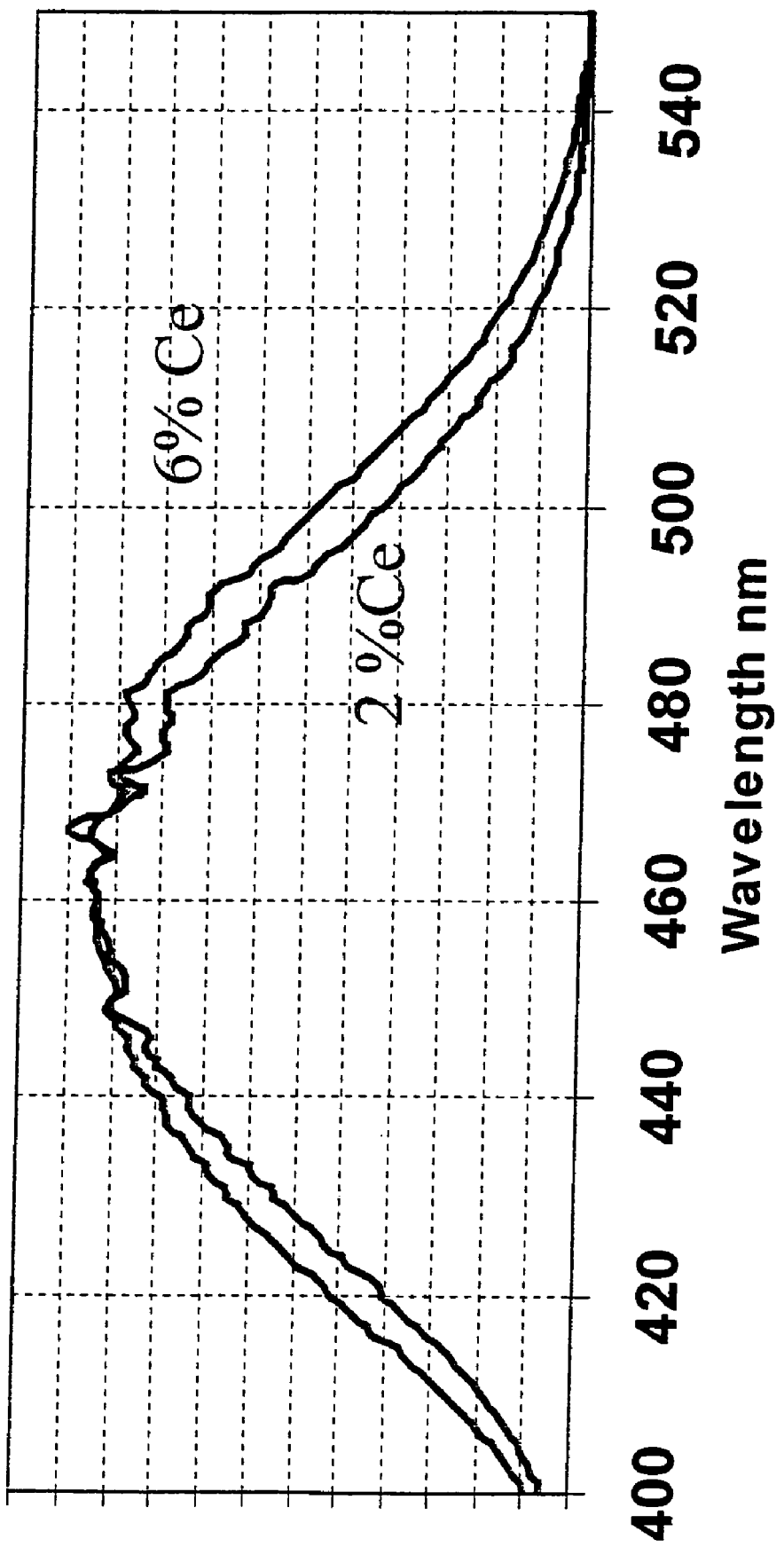
FIG. 2 illustrates the excitation spectra for 2 mol % $Ce^{3+}$ doped $Y_3Al_5O_{12}$ and for 6 mol % $Ce^{3+}$ doped $Y_3Al_5O_{12}$ according to embodiments of the invention.

In a first embodiment, the excitation spectrum of $Y_3Al_5O_{12}:Ce^{3+}$ is broadened by increasing the concentration of $Ce^{3+}$ dopant in the phosphor. As described above, $Y_3Al_5O_{12}:Ce^{3+}$ phosphors conventionally have a concentration of $Ce^{3+}$ dopant of about 2 mol %, a concentration that gives good absorption, for exmple, 80% absorption when pumped by an LED emitting light at 450 nm. The inventors have observed that as the concentration of $Ce^{3+}$ in garnet phosphors such as $Y_3Al_5O_{12}:Ce^{3+}$ increases, the excitation spectrum widens. The excitation spectrum begins to widen at a $Ce^{3+}$ concentration of about 4 mol %. As the $Ce^{3+}$ concentration increases, eventually concentration quenching is observed. The concentration at which concentration quenching sets in may depend on the purity of the garnet host material. The more pure the host, the higher the $Ce^{3+}$ concentration at which quenching occurs. FIG. 2 illustrates the excitation spectra for 2 mol % $Ce^{3+}$ doped $Y_3Al_5O_{12}$ and for 6 mol % $Ce^{3+}$ doped $Y_3Al_5O_{12}$ according to the first embodiment of the invention.

Figure 5:
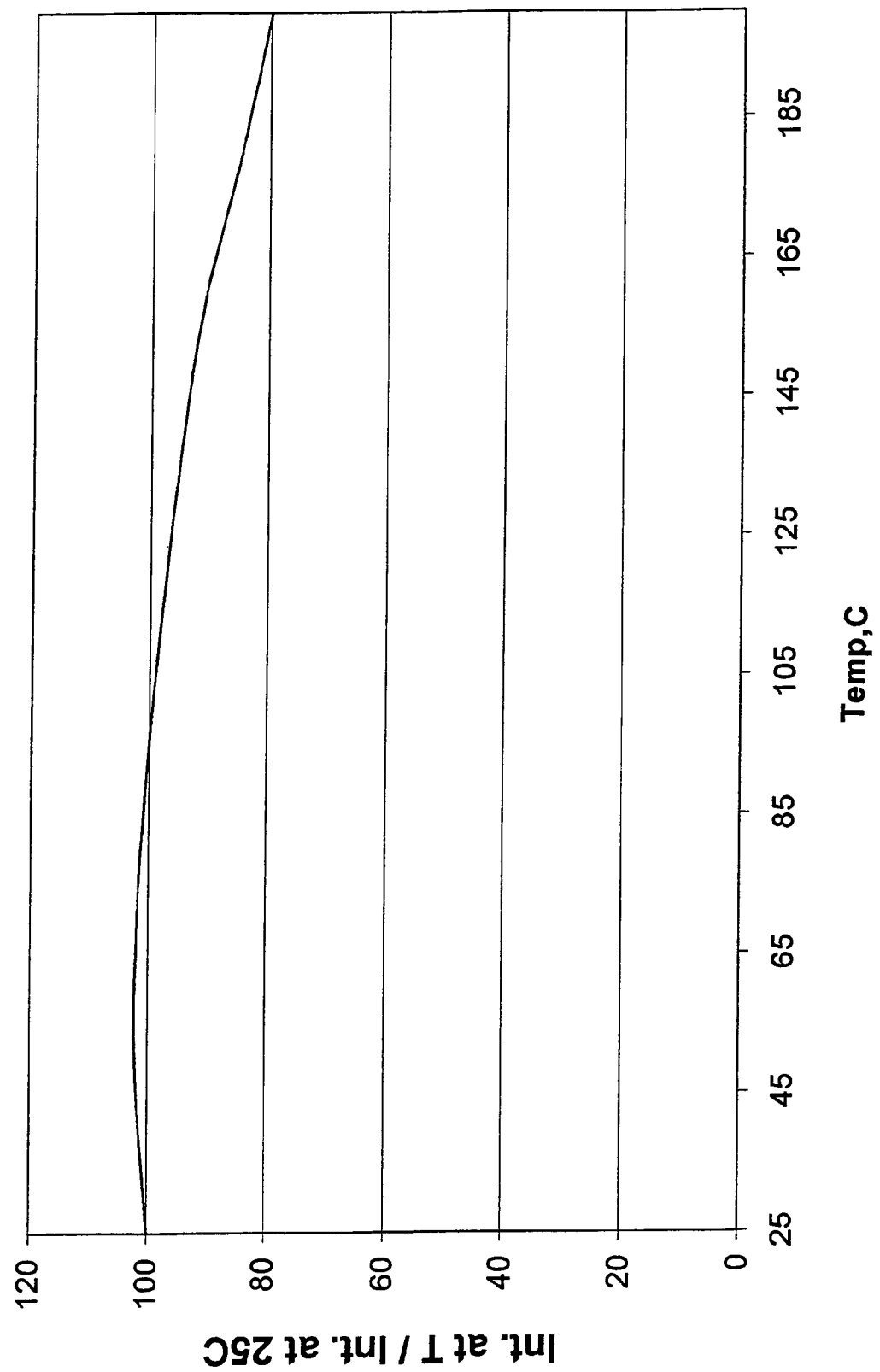
FIG. 5 illustrates the emission intensity of 6 mol % $Ce^{3+}$ doped $Y_3Al_5O_{12}$ as a function of temperature.

The inventors have observed that in addition to widening the excitation spectrum, increasing the concentration of $Ce^{3+}$ undesirably reduces the efficiency of the phosphor as the operating temperature of the phosphor converted LED increases. FIG. 5 illustrates the emission intensity at a given temperature relative to the emission intensity at room temperature. As illustrated in FIG. 5, at 200° C., 6 mol % $Ce^{3+}$ doped $Y_3Al_5O_{12}$:$Ce^{3+}$ emits light at 80% of the intensity at room temperature, 25° C.

Highly $Ce^{3+}$ doped $Y_3Al_5O_{12}$ is particularly useful for applications requiring white light. The narrow excitation spectrum of conventional $Y_3Al_5O_{12}$:$Ce^{3+}$ leads to a gap in the combined spectrum between the emission of the pump LED and the emission of the phosphor. Widening the excitation spectrum permits the use of a pump LED emitting light of a wavelength that can at least partially fill the spectrum gap, which potentially has a favorable effect on the color rendering of the composite light emitted by the device.

Though in the above discussion of the first embodiment the garnet host $Y_3Al_5O_{12}$ is specifically mentioned, it is to be understood that the above-described $Ce^{3+}$ concentrations may be applied to garnet phosphors having the general formula $(Lu_{1-x-y-a-b}Y_xGd_y)_3(Al_{1-z}Ga_z)_5O_{12}$:$Ce_aPr_b$ wherein $0<x<1$, $0<y<1$, $0<z\leq0.1$, $0<a\leq0.2$ and $0<b\leq0.1$.

Figure 3:
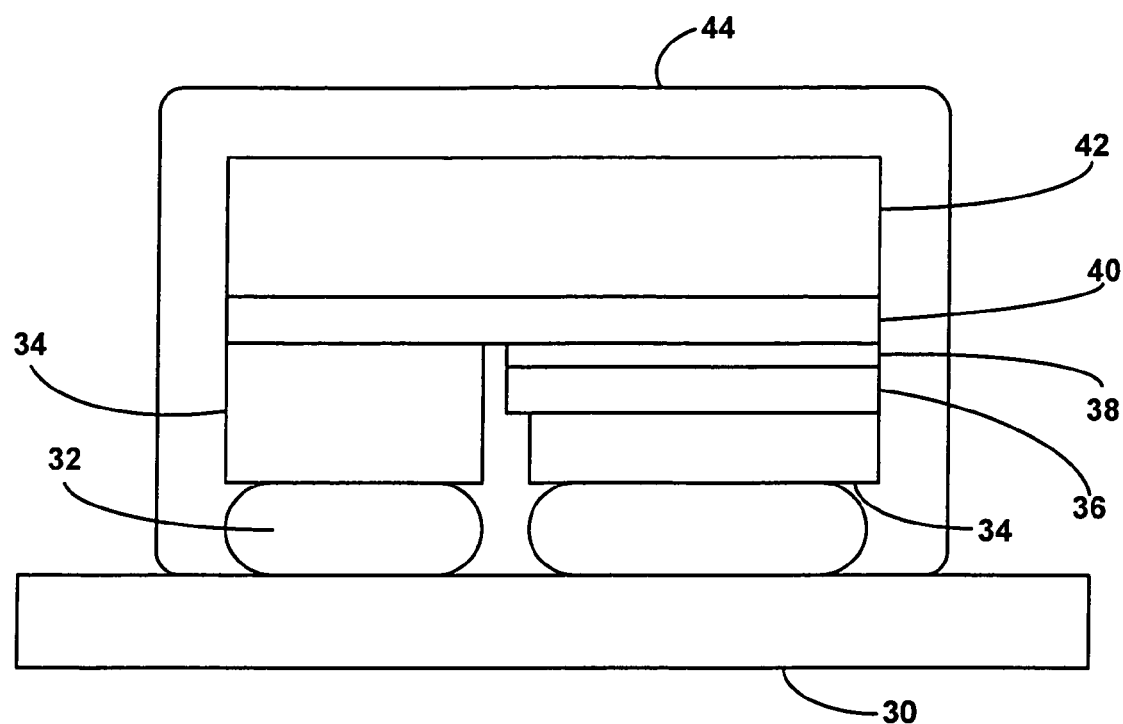
FIG. 3 is a cross sectional view of a first example of a phosphor-converted semiconductor light emitting device.
Figure 4:
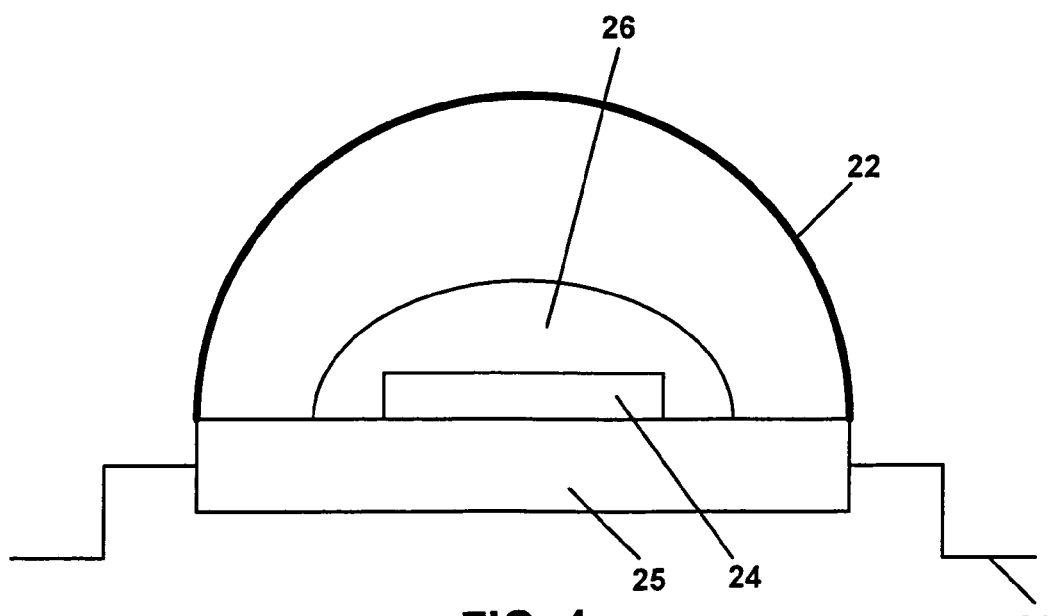
FIG. 4 is a cross sectional view of a second example of a phosphor-converted semiconductor light emitting device.

The wide-excitation spectrum cerium-doped garnet phosphors described above are suitable for use with any light source emitting light having a wavelength capable of exciting the phosphors, including, for example, discharge lamps and blue- and UV-emitting semiconductor light emitting devices such as light emitting diodes and laser diodes. FIGS. 3 and 4 illustrate two phosphor-converted semiconductor light emitting devices incorporating the phosphors described in the above embodiments. In FIG. 3 cerium-doped garnet phosphor layer 44 covers a light emitting diode including an n-type region 40, and active region 38, and a p-type region 36 formed over a substrate 42. Contacts 34 are formed on the n- and p-type regions, then the light emitting diode is flipped over and electrically and physically connected to a submount 30 by interconnects 32. The light emitting device need not be a flip chip and may be oriented such that light is extracted from the device through the semiconductor device layers, rather than through the substrate.

Phosphor layer 44 may be deposited as a thin film by, for example, electron beam evaporation, thermal evaporation, rf-sputtering, chemical vapor deposition, or atomic layer epitaxy; or as a conformal layer over LED 1 by, for example, screen printing, stenciling as described in U.S. Pat. No. 6,650, 044, or by electrophoretic deposition as described in U.S. Pat. No. 6,576,488. Thin films are described in more detail in U.S. Pat. No. 6,696,703. Each of U.S. Pat. No. 6,696,703, U.S. Pat. No. 6,650,044 and U.S. Pat. No. 6,576,488 are incorporated herein by reference. In contrast to a thin film, which typically behaves as a single, large phosphor particle, the phosphor in a conformal layer generally behaves as multiple phosphor particles. In addition a thin film typically contains no materials other than phosphor. A conformal layer often includes materials other than phosphor, such as, for example, silica.

FIG. 4 illustrates a second embodiment of a device incorporating a cerium-doped garnet phosphor. The device of FIG. 4 is a packaged light emitting diode including a light emitting diode 24 optionally mounted on a submount (not shown), supported by a base 25, and electrically connected to leads 21. A lens 22 protects light emitting diode 24. A cerium-doped garnet phosphor as described in the above embodiments may be dispersed in an encapsulant material 26 that is injected in a space between lens 22 and light emitting diode 24. The encapsulant may be, for example, silicone, epoxy, or any other organic or inorganic material which is suitable for incorporating phosphor and adheres to the primary light emitting device.

In some embodiments of the devices illustrated in FIGS. 3 and 4, the cerium doped garnet phosphor is mixed with one or more additional wavelength-converting materials. Such devices may be used to create white light or to create light of a color that is difficult to achieve with an unconverted LED or a single wavelength-converting material. Each wavelength-converting material may be pumped by either light emitted by the light emitting diode or by light emitted by one of the other wavelength-converting materials. In some embodiments, the cerium doped garnet phosphors described above may be used in combination with a red-emitting phosphor and a blue light emitting diode to produce white light. Examples of suitable red-emitting phosphors include $(Ca_{1-x}Sr_x)S$:$Eu^{2+}$ wherein $0<x\leq1$ including, for example, $CaS$:$Eu^{2+}$ and $SrS$:$Eu^{2+}$; and $(Sr_{1-x-y}Ba_xCa_y)_{2-z}Si_{5-a}Al_aN_{8-a}O_a$:$Eu_z^{2+}$ wherein $0\leq a<5$, $0<x\leq1$, $0\leq y\leq1$, and $0<z\leq1$ including, for example, $Sr_2Si_5N_8$:$Eu^{2+}$.

Figure 6:
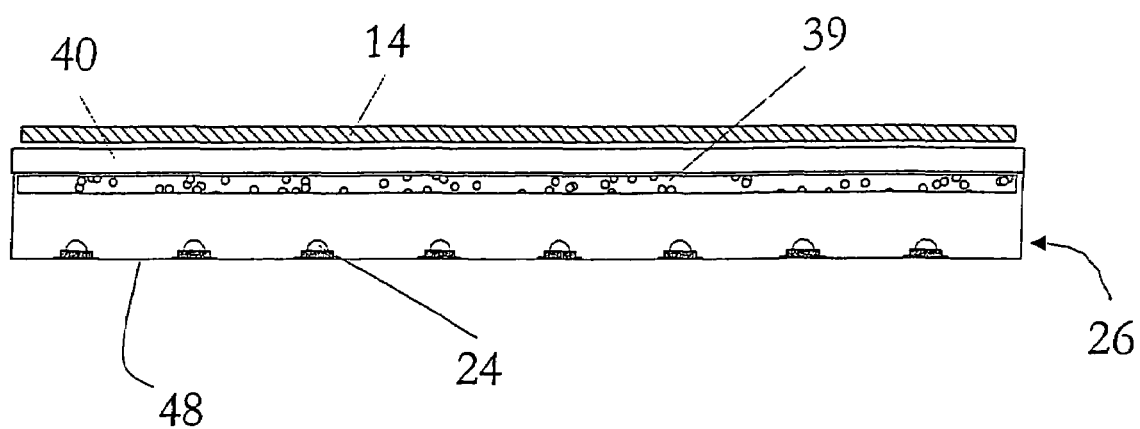
FIG. 6 illustrates a display according to embodiments of the present invention.

In the devices illustrated in FIGS. 3 and 4, the phosphors are disposed adjacent to the LED. FIG. 6 illustrates a second application, a display device with phosphors spaced apart from one or more LEDs. The device illustrated in FIG. 6 is described in more detail in application Ser. No. 10/678,541, filed Oct. 3, 2003, titled "LCD Backlight Using Two-Dimensional Array LEDs," and incorporated herein by reference.

FIG. 6 is a side view of an LCD display. An array of LEDs 24 is placed on the rear panel of the backlight 26. The backlight 26 is covered with a diffusing cover plate 40. The diffuser 40 is for example made of acrylic or glass, with a roughened surface for diffusing light. Alternatively, the diffuser 40 may have light scattering particles with the acrylic or glass sheet. Many types of diffusers are known and may be used with the backlight 26. A transparent plate may be used instead of the diffuser 40 if the light output of the backlight 26 is sufficiently diffuse without a diffuser. Additional films (not shown) for increasing the brightness or efficiency might be used on top of the diffuser, just before the LCD, as for example Brightness Enhancement Film and Dual Brightness Enhancement Film, as for example produced by 3M.

The back plane and the sidewalls of the backlight 26 are covered with highly reflective materials. Good results have been obtained with a white diffuse reflective film on the back (e.g., E60L, produced by Toray, Japan), and a specular reflecting material on the sidewalls (e.g., Miro material, as produced by Alanod, Germany), but other configurations work as well. The materials used should have a high coefficient of reflection, preferably >90%. By using these high reflective materials, a high recycling efficiency is achieved. This is in particular important when Brightness Enhancement Films are used, as mentioned above, as these films reflect the light which can not be used in the first pass, and which needs to be recycled in order to contribute to the output of the LCD during a second or third pass.

LCD panel 14 is placed in front of the backlight 26. The LCD panel 14 may be a conventional LCD, having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 14 and the backlight 26, additional films can be used, such as a brightness enhancement film (BEF) or polarization recovery film (DBEF).

LEDs 26 are generally blue or UV-emitting LEDS. A phosphor layer 39, including any of the cerium doped phosphors described above alone or in combination with other phosphors, is formed on the cover plate 40, rather than directly on LEDs 26. In some embodiments, different phosphor layers are formed on different surfaces of cover plate 40. The cover plate 40 may or may not be a diffuser, depending on the amount of diffusing performed by the phosphor. Spacing phosphor layer 39 apart from LEDs 26 is attractive because light emitted from the phosphor to the rear of the backlight 26 has a larger recycling efficiency than into the LED chips, due to the high reflectivity of the films used in the backlight 26. In addition to the recycling efficiency, the phosphors are not required to withstand the high temperatures near the LEDs and are not required to be chemically compatible with the LEDs, increasing he number of possible suitable phosphors and potentially improving the efficiency and lifetime of the device. From a logistics point of view, this solution is attractive as well, as the blue backlight can be used for a large range of different displays, with different types of color filters, and only the phosphor layer thickness and phosphor concentration has to be optimized to fit a particular LCD.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
   providing a semiconductor light emitting device comprising a light emitting layer disposed between an n-type region and a p-type region, wherein the light emitting layer is configured to emit light of a first wavelength; and
   selecting a cerium concentration in a cerium-doped garnet phosphor such that the phosphor has a broader excitation spectrum than 2 mol % cerium $Y_3Al_5O_{12}:Ce^{3+}$; and
   disposing the phosphor in a path of light emitted by the light emitting device.

2. The method of claim 1 wherein selecting a cerium concentration comprises selecting a cerium concentration between about 4 mol % and about 8 mol %.

3. The method of claim 1 wherein:
   the cerium-doped garnet phosphor is a first wavelength converting material, the first wavelength converting material being configured to absorb light of the first wavelength and emit light of a second wavelength; and
   the structure further comprises a second wavelength-converting material disposed in a path of light emitted by the light emitting device, wherein the second wavelength-converting material is configured to absorb light of one of the first wavelength and the second wavelength and emit light of a third wavelength longer than the second wavelength.

4. The method of claim 3 wherein the second wavelength-converting material is one of $(Ca_{1-x}Sr_x)S:Eu^{2+}$ wherein $0<x\leq1$; $CaS:Eu^{2+}$; $SrS:Eu^{2+}$; $(Sr_{1-x-y}Ba_xCa_y)_{2-z}Si_{5-a}Al_aN_{8-a}O_a:Eu_z^{2+}$ wherein $0\leq a<5, 0<x\leq1, 0\leq y\leq1$, and $0<z\leq1$; and $Sr_2Si_5N_8:Eu^{2+}$.

5. The method of claim 1 wherein disposing the phosphor in a path of light emitted by the light emitting device comprises spacing the cerium-doped garnet phosphor apart from the light emitting device.

* * * * *